US009637817B2

(12) United States Patent
Köhler et al.

(10) Patent No.: US 9,637,817 B2
(45) Date of Patent: May 2, 2017

(54) PROCESS ROLLER FOR RECEIVING AND GUIDING SUBSTRATES IN STRIP FORM IN VACUUM COATING INSTALLATIONS

(71) Applicant: FHR Anlagenbau GmbH, Ottendorf-Okrilla (DE)

(72) Inventors: Lutz Köhler, Radebeul (DE); Daniel Michel, Grossenhain (DE); Anthony Nobel, Elsterheide (DE); Marco Grafe, Dresden (DE)

(73) Assignee: FHR Anlagenbau GmbH, Ottendorf-Okrilla (DE)

( * ) Notice: Subject to any disclaimer, the term of this patent is extended or adjusted under 35 U.S.C. 154(b) by 33 days.

(21) Appl. No.: 14/377,440

(22) PCT Filed: Feb. 11, 2013

(86) PCT No.: PCT/EP2013/052697
§ 371 (c)(1),
(2) Date: Aug. 7, 2014

(87) PCT Pub. No.: WO2013/120809
PCT Pub. Date: Aug. 22, 2013

(65) Prior Publication Data
US 2015/0122179 A1 May 7, 2015

(30) Foreign Application Priority Data
Feb. 13, 2012 (DE) .......... 10 2012 202 086

(51) Int. Cl.
C23C 14/56 (2006.01)
C23C 16/02 (2006.01)
(Continued)

(52) U.S. Cl.
CPC .......... *C23C 14/562* (2013.01); *C23C 14/541* (2013.01); *C23C 16/0209* (2013.01); *C23C 16/46* (2013.01); *C23C 16/54* (2013.01)

(58) Field of Classification Search
CPC .............. C23C 14/541; C23C 16/0209; C23C 16/4586; C23C 16/46
See application file for complete search history.

(56) References Cited

U.S. PATENT DOCUMENTS 3,170,576 A * 2/1965 Frank ........................... 414/217
4,215,170 A * 7/1980 Vilaprinyo Oliva ...... B44C 1/14
156/230

(Continued)

FOREIGN PATENT DOCUMENTS

CH       352988      3/1961
CN   101627147 A    1/2010
(Continued)

OTHER PUBLICATIONS www.espacenet.com. English language machine translation of DE 3331865. Translated on Jul. 8, 2016.*
(Continued)

*Primary Examiner* — Jeffrie R Lund
*Assistant Examiner* — Yuechuan Yu
(74) *Attorney, Agent, or Firm* — DASCENZO Intellectual Property Law, P.C.

(57) ABSTRACT

A process roller for receiving and guiding substrates in strip form in vacuum coating installations. The process roller comprises a heater located inside the process roller, in the form of an elongated radiant heater, and also a cylindrical lateral surface for receiving a substrate in strip form, the process roller being mounted rotatably about an axis of rotation in a vacuum process chamber. A particularly uniform temperature distribution can be achieved on the pro-
(Continued)

cess roller's lateral surface by the process roller (2) being configured in a vacuum-tight manner, by the lateral surface (3) of the process roller (2) being connected in a vacuum-tight manner to two end caps (4, 5), which have a flattened, outwardly curved hemispherical form, by the interior space of the process roller (2) being connected to a vacuum connection (6), and by the radiant heater (8) extending into the region of the end caps (4, 5).

17 Claims, 1 Drawing Sheet

(51) Int. Cl.
C23C 16/46 (2006.01)
C23C 14/54 (2006.01)
C23C 16/54 (2006.01)

(56) References Cited

U.S. PATENT DOCUMENTS 4,736,226 A * 4/1988 Mogi ............... G03G 15/2064
219/216
2011/0030794 A1* 2/2011 Teng ............................ 136/262

FOREIGN PATENT DOCUMENTS

| DE | 1900652 A1 | * | 8/1970 | ............... B01D 3/08 |
|---|---|---|---|---|
| DE | 3331865 | | 6/1984 | |
| DE | 3331865 A1 | | 6/1984 | |
| DE | 4103867 | | 11/1991 | |
| DE | 4203631 A1 | | 8/1993 | |
| DE | 29710620 | | 10/1998 | |
| DE | 4203631 | | 6/2000 | |
| DE | 102011055708 | | 5/2013 | |
| JP | 57-101663 | | 6/1982 | |
| JP | 57101663 | | 6/1982 | |
| JP | 2-11766 | | 1/1990 | |
| JP | 02011766 | | 1/1990 | |
| JP | 02038554 A | * | 2/1990 | |
| JP | 04225788 A | * | 8/1992 | |
| JP | 08210923 A | * | 8/1996 | |
| TW | 200613574 | | 5/2006 | |
| TW | M415915 | | 11/2011 | |
| TW | 201200628 | | 1/2012 | |

OTHER PUBLICATIONS

Machine translation of DE 4203631, published Jun. 8, 2000; downloaded from https://www.google.com/patents/DE4203631C2?cl=en &dq=de+4203631&hl=en&sa=X &ei=38PjU4HjK6nWiwLLxYCwDA&ved=0CBwQ6AEwAA.
English-language abstract of JP 02011766, published Jan. 16, 1990; downloaded from http://www19.ipdl.inpit.go.jp/PA1/result/detail/main/w66Mg7aDA402011766P1.htm.
English-language abstract of JP 57101663, published Jun. 24, 1982; downloaded from http://www19.ipdl.inpit.go.jp/PA1/result/detail/main/w0sEpaaDA357101663P1.htm.
Search Report issued in connection with Taiwan Patent Application No. 102105141, 2 pages (with English-language translation), Taiwan Intellectual Property Office, Aug. 12, 2014.
English-language abstract of Taiwan Patent Publication No. TW 200613574, May 1, 2006.
English-language abstract of Taiwan Patent Publication No. TW 201200628, Jan. 1, 2012.
English-language machine translation of the specification of Taiwan Patent No. M415915 (Taiwan Patent Application No. 100211884), Nov. 11, 2011.
English-language abstract of Japan Patent Publication No. JP 2-11766, Jan. 16, 1990.
English-language abstract of Japan Patent Publication No. JP 57-101663, Jun. 24, 1982.
English-language machine translation of the specification and claims of Swiss Patent No. 352988, Mar. 31, 1961.
English-language abstract of German Patent No. 3331865, Jun. 7, 1984.
English-language abstract of German Patent No. 4103867, Nov. 21, 1991.
English-language machine translation of the specification and claims of German Patent No. 29710620, Oct. 15, 1998.
English-language abstract of German Patent Publication No. 102011055708, May 29, 2013.
English-language machine-generated translation of the abstract of European Patent No. 0555518, Jan. 8, 1997 (corresponds to German Patent Application Publication No. DE4203631A1, Aug. 12, 1993).
English-language abstract of German Patent Application Publication No. DE3331865A1, Jun. 7, 1984.
English-language abstract of China Patent Application Publication No. CN101627147A, Jan. 13, 2010.

* cited by examiner

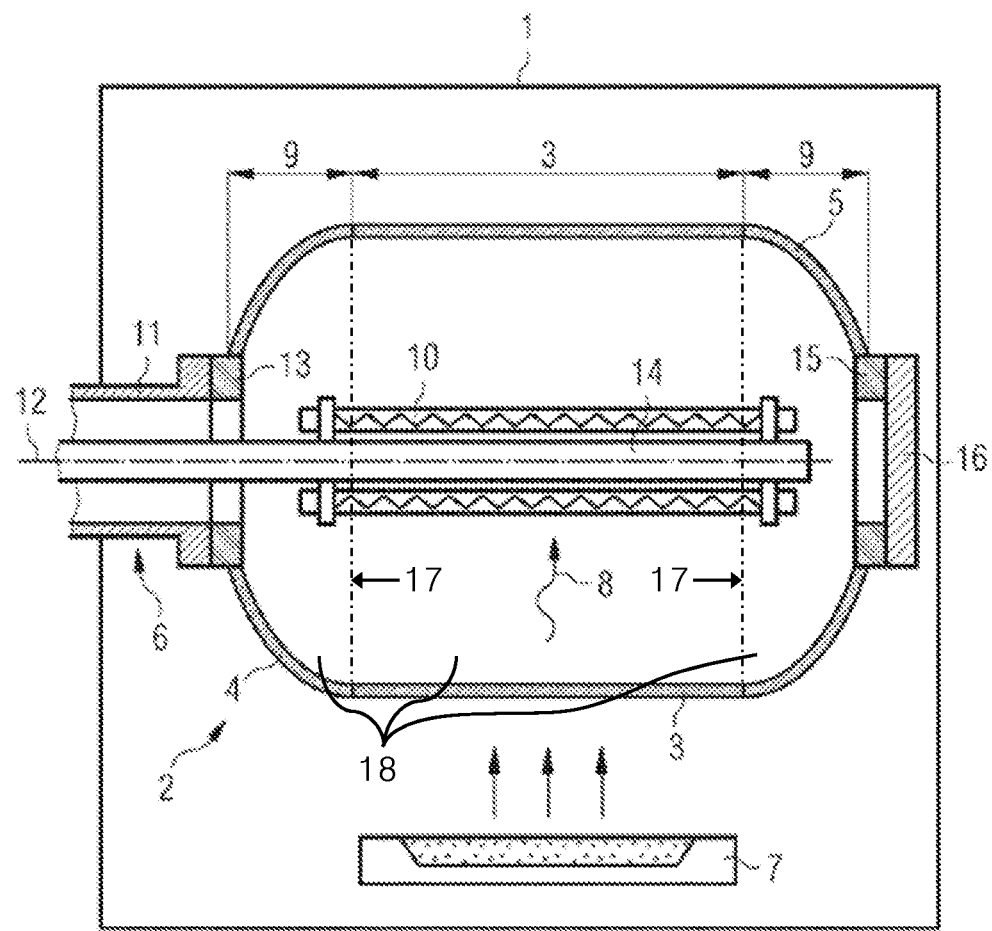

PROCESS ROLLER FOR RECEIVING AND GUIDING SUBSTRATES IN STRIP FORM IN VACUUM COATING INSTALLATIONS

The invention relates to a process roller for receiving and guiding substrates in strip form in vacuum coating installations comprising a heater located inside the process roller, in the form of an elongated radiant heater, and also a cylindrical lateral surface for receiving a substrate in strip form, the process roller being mounted rotatably about an axis of rotation in a vacuum process chamber.

The coating of substrates in strip form is usually performed in vacuum coating installations in which a process roller is arranged rotatably over a coating source in a vacuum process chamber. The substrate in strip form is generally guided from a supply roller within the vacuum process chamber over part of the circumferential surface of the process roller and subsequently wound up on a storage roller, likewise located within the vacuum process chamber.

In the case of some processes, it is required that the temperature of the substrate is brought to a predetermined process temperature in the vacuum process chamber while it is running over the process roller. This temperature control is generally performed by way of the contact of the substrate in strip form with the roller body of the process roller. A heat source, for example one or more radiant heaters that are arranged inside the process roller, is used for this purpose. The heat transfer to the substrate in strip form takes place by thermal conduction as a result of the contact of the substrate in strip form with the roller body while it is running over the process roller.

The temperatures to be reached of the process roller typically lie in the range of 200-600° C., depending on the type of coating to be applied to the substrate. In the higher temperature range of 400-600° C. it has been found that, to achieve a defined temperature distribution on the surface of the process roller, any convection inside the process roller must be avoided.

In order to achieve this, a sufficient vacuum must be generated inside the process roller. This can either be achieved by the interior space of the process roller being provided with the same vacuum that also prevails in the rest of the vacuum process space, i.e. the roller body may in this case be partially open with respect to the vacuum process space, or by generating a separate negative pressure in the interior space of the process roller with the aid of an independent vacuum generator. In the latter case, the interior space of the roller body must be insulated from the vacuum process space in a vacuum-tight manner.

The advantage of the latter, albeit somewhat more complex, variant can be seen in that any contamination of the interior space of the process roller that is otherwise possible, and is undesired, can be prevented in this way. This allows the servicing effort to be reduced considerably.

By appropriate dimensioning of the process roller, it must be achieved that the same temperature prevails in all regions of the contact area of the substrate in strip form with the process roller, i.e. the corresponding part of the lateral surface of the process roller.

DE 42 03 631 C2 discloses an apparatus for treating an oxide layer on a substrate in strip form. The substrate in strip form is guided from a supply roller via guiding rollers to a process roller in a vacuum chamber and passed from there to a winding-up roller. The process roller is in this case partially wrapped around by the substrate in strip form and, during the contact with the process roller, is made to pass over a container with a material to be vapour-deposited.

In the case of process rollers for wide substrates in strip form that have to be heated to a predetermined coating temperature, elongated radiant heaters are used in the process roller with a technically achievable overlength in relation to the width of the substrate in strip form. However, the outer regions of the lateral surface as well as the end faces of the process roller are in this case exposed to less radiant power than the middle region of the lateral surface of the process roller. As a result, zones with lower temperatures form at the periphery of the lateral surface and cause a heat flow from the direction of the middle region of the lateral surface.

Apart from the temperature or the temperature distribution to be reached on the roller surface, heating-up and cooling-down rates play a decisive role in the geometrical design of the process roller. The fact that processes involving substrates in strip form very often take place in so-called batch systems is problematic. This means that the supply roller and the winding-up roller for the substrate in strip form are arranged in the coating installation, so that, after the coating of a roll, the installation must be exposed to the outside air and serviced in order to allow the storage roller and the winding-up roller to be exchanged. In this connection, the process roller must also cool down beforehand in order to allow work to be carried out safely when changing the rollers.

The objective here is always for the process roller to cool down as quickly as possible, while taking into account the characteristic material data. The cooling-down operation may be performed by gas cooling inside the process roller, but most of the energy is given off to the outside by way of radiant heat. Here, the variation of the temperature over time is influenced significantly by the mass of the process roller.

The object on which the invention is based is to design a process roller for receiving and guiding substrates in strip form in vacuum coating installations in such a way that the disadvantages described are avoided.

The object is achieved in the case of a process roller of the type mentioned at the beginning by the process roller being configured in a vacuum-tight manner, by the lateral surface of the process roller being fixedly connected to two end caps, which have a flattened, outwardly curved hemispherical form, the process roller being provided with a vacuum connection, and by the radiant heater extending into the region of the end caps.

As a result of bringing the peripheral zone geometrically closer to the radiant heating device, much better heating of the peripheral zone of the lateral surface of the process roller is achieved by the invention.

The pressure difference between the vacuum in the vacuum process chamber and the interior of the process roller is preferably at most 1 bar.

In continuation of the invention, the lateral surface and the wall of the two end caps of the process roller are configured as a lightweight construction of high-grade steel, which is made possible by the special design of the end caps.

The radiant heater consists of at least one heating rod arranged in the process roller as an infrared heater.

Furthermore, the radiant heater is connected to an electrical energy source by way of the vacuum connection.

In a continuation of the invention, one of the end caps is connected to a supporting tube, which is arranged in the axis of rotation of the process roller and serves at the same time as a vacuum connection, a rod-shaped holding device being provided for the heating rods of the radiant heater and passing centrally through the supporting tube.

In order to allow easy servicing of the radiant heater, the inside diameter of the supporting tube is greater than the cross section of the radiant heater located on the holding device. Furthermore, arranged in the end cap opposite from the vacuum connection is a flange with an opening, which is connected in a vacuum-tight manner to a service cover. The radiant heater can be easily removed and fitted through this opening.

The invention will be explained in more detail below on the basis of an exemplary embodiment.

The associated drawing shows a schematic representation of the process roller according to the invention in a vacuum process chamber.

Corresponding to the invention, the process roller 2, arranged rotatably in a vacuum process chamber 1 indicated schematically in the figure of the drawing, is configured in a vacuum-tight manner. The process roller 2 has a lateral surface 3, which is securely closed by two end caps 4, 5, so that the interior space 18 of the process roller 2 is hermetically sealed off. The special feature of the end caps 4, 5 is that they have a flattened, outwardly curved hemispherical form similar to a dished boiler end. The interior space 18 of the process roller 2 is in connection with a vacuum source (not represented) by way of a vacuum connection 6. The process roller 2 is coupled to a rotary drive (not represented), arranged outside the vacuum chamber 1.

The lateral surface 3 serves for receiving and guiding a substrate in strip form (not represented) to be coated, which is guided by suitable deflecting and guiding rollers around a portion of the lateral surface 3 in such a way that there forms a contact area with respect to the lateral surface 3. The substrate in strip form is heated up to the temperature required for the vapour-depositing by being directly in contact with the lateral surface 3.

The material in strip form is in this case guided over the lateral surface in such a way that the contact area forms over a vapour source 7 located under the process roller 2.

There is also located inside the process roller 2 a radiant heater 8, which extends into the regions (interior volumes 17) of the end caps 4, 5. This has the effect of bringing the peripheral zone 9 of the process roller 2 geometrically closer to the radiant heater 8, which results in much better heating of the peripheral zone 9 of the lateral surface 3 of the process roller 2. In addition, mechanical stress peaks in the curved peripheral zone 9 are avoided by the harmonious variation in temperature.

The lateral surface 3 and the wall of the two end caps 4, 5 of the process roller 2 are configured as a lightweight construction of high-grade steel or some other suitable material. The pressure difference between the vacuum in the vacuum process chamber 1 and the interior of the process roller 2 should not exceed 1 bar.

The radiant heater 8, formed for example as an infrared heater, is arranged centrally in the process roller and consists of a number of heating rods 10, which are fastened to a holding device 14.

A supporting tube 11, which is connected to one of the end caps 4; 5 in the axis of rotation 12 of the process roller 2, is provided for the vacuum connection to the interior space of the process roller 2. For this purpose, one of the end caps 4; 5 is provided with a flange 13, to which the supporting tube 11 is fastened, for example by way of a vacuum-tight screwed connection.

Through the supporting tube 11 there also extends the rod-shaped holding device 14 for the radiant heater 8. The required connection of the radiant heater 8 to an electrical energy source takes place by way of the holding device 14. To allow the radiant heater 8 to be easily removed, plug-in connections may be provided for the electrical connection.

The supporting tube 11 serves at the same time for the rotatable mounting of the process roller 2 in a side wall of the vacuum chamber/process chamber 1. In a corresponding way, the process roller 2 may also be mounted on both sides in the process chamber 1.

In the interests of easy servicing of the radiant heater 8, the inside diameter of the supporting tube 11 is greater than the cross section of the radiant heater 8 mounted on the holding device 14. The connection of the radiant heater 8 to an electrical energy source preferably takes place by the vacuum connection 6. Finally, arranged in the end cap 4; 5 opposite from the vacuum connection 6 is a central flange 15 with an opening, which is closed in a vacuum-tight manner by a service cover 16. Through this opening, the radiant heater 8 can be easily removed for servicing purposes and fitted again.

LIST OF DESIGNATIONS

1 Vacuum process chamber
2 Process roller
3 Lateral surface
4, 5 End cap
6 Vacuum connection
7 Vapour source
8 Radiant heater
9 Peripheral zone
10 Heating rod
11 Supporting tube
12 Axis of rotation
13 Flange
14 Holding device
15 Flange
16 Service cover
17 Interior volume of end cap
18 Interior space of process roller

The invention claimed is:

1. A process roller for receiving and guiding substrates in strip form in vacuum coating installations comprising an interior space (18), a radiant heater (8) that is elongated and completely enclosed within the interior space of the process roller, and also a cylindrical lateral surface for receiving a substrate in strip form, the process roller being mounted rotatably about an axis of rotation (12) in a vacuum process chamber, wherein the process roller (2) is configured in a vacuum-tight manner, in that the cylindrical lateral surface (3) of the process roller (2) is connected in a vacuum-tight manner to two end caps (4, 5), which have a curved form that is outwardly curved along the axis of rotation (12) and define interior volumes (17), the interior space of the process roller is defined by the interior volumes of the end caps and an interior volume of the cylindrical lateral surface, a supporting tube (11) is arranged coaxially with the axis of rotation (12) of the process roller (2) and is connected to one of the end caps (4, 5), the interior space of the process roller (2) is hermetically sealed and connected to a vacuum connection (6) through the supporting tube (11) to generate a vacuum in the interior space, a rod-shaped holding device (14) extends through the supporting tube (11) and into the process roller (2), and the radiant heater (8) is fastened to the rod-shaped holding device (14) and extends into and between the interior volumes (17) of the end caps (4, 5).

2. The process roller according to claim 1, characterized in that a pressure difference between the vacuum process chamber (1) and the interior space (18) of the process roller (2) is at most 1 bar.

3. The process roller according to claim 1, wherein each of the two end caps (4, 5) includes a wall, the process roller characterized in that the cylindrical lateral surface (3) and the walls of the two end caps (4, 5) of the process roller are constructed from steel.

4. The process roller according to claim 1, characterized in that the radiant heater (8) is arranged centrally in the process roller (2) and consists of a number of heating rods (10), which are fastened to the rod-shaped holding device (14).

5. The process roller according to claim 4, characterized in that the radiant heater (8) is configured as an infrared heater.

6. The process roller according to claim 5, characterized in that the radiant heater (8) is connected to an energy source by way of the vacuum connection (6).

7. The process roller according to claim 6, characterized in that the rod-shaped holding device (14) is fastened centrally in the supporting tube (11).

8. The process roller according to claim 7, characterized in that an inside diameter of the supporting tube (11) is greater than a diameter of a cross section of the radiant heater (8).

9. The process roller according to claim 8, characterized in that one of the two end caps (4, 5) is opposite from the vacuum connection (6) and has a central flange (15), which is connected in a vacuum-tight manner to a cover (16).

10. The process roller according to claim 5, characterized in that the rod-shaped holding device (14) is fastened centrally in the supporting tube (11).

11. The process roller according to claim 10, characterized in that an inside diameter of the supporting tube (11) is greater than a diameter of a cross section of the radiant heater (8).

12. The process roller according to claim 11, characterized in that one of the two end caps (4, 5) is opposite from the vacuum connection (6) and has a central flange (15), which is connected in a vacuum-tight manner to a cover (16).

13. The process roller according to claim 4, characterized in that the radiant heater (8) is connected to an energy source by way of the vacuum connection (6).

14. The process roller according to claim 13, characterized in that one of the two end caps (4, 5) is opposite from the vacuum connection (6) and has a central flange (15), which is connected in a vacuum-tight manner to a cover (16).

15. The process roller according to claim 4, characterized in that the rod-shaped holding device (14) for the heating rods (10) of the radiant heater (8) is fastened centrally in the supporting tube (11).

16. The process roller according to claim 15, characterized in that an inside diameter of the supporting tube (11) is greater than a diameter of a cross section of the radiant heater (8).

17. The process roller according to claim 15, characterized in that one of the two end caps (4, 5) is opposite from the vacuum connection (6) and has a central flange (15), which is connected in a vacuum-tight manner to a cover (16).

* * * * *